(12) United States Patent
Luong

(10) Patent No.: US 6,728,929 B1
(45) Date of Patent: Apr. 27, 2004

(54) SYSTEM AND METHOD TO INSERT A TCP CHECKSUM IN A PROTOCOL NEUTRAL MANNER

(75) Inventor: Hung Luong, Simi Valley, CA (US)

(73) Assignee: Spirent Communications of Calabasas, Inc., Calabasas, CA (US)

( * ) Notice: Subject to any disclaimer, the term of this patent is extended or adjusted under 35 U.S.C. 154(b) by 430 days.

(21) Appl. No.: 09/788,014

(22) Filed: Feb. 16, 2001

(51) Int. Cl.[7] .................................. G06F 11/10
(52) U.S. Cl. ........................ 714/807; 370/465
(58) Field of Search ........................ 714/807, 799, 714/701; 370/465, 216, 242

(56) References Cited

U.S. PATENT DOCUMENTS

2001/0036196 A1 * 11/2001 Blightman et al. ......... 370/465

FOREIGN PATENT DOCUMENTS

EP    0 752 654 A2 * 8/1997 ............ G06F/11/10

OTHER PUBLICATIONS

Maclean et al., An outboard processor for high performance implementation of transport layer protocols, Global Telecommunications Conference, 1991, pp. 1728–1732, vol. 3.*

Stone et al., Performance of Checksums and CRC's over Real Data, IEEE/ACM Transactions on Networking, vol. 6, No. 5, Oct. 1998, pp. 529–543.*

* cited by examiner

Primary Examiner—Albert Decady
Assistant Examiner—Dipakkumar Gandhi
(74) Attorney, Agent, or Firm—Blakely, Sokoloff, Taylor & Zafman

(57) ABSTRACT

A method and apparatus for calculating and inserting a TCP checksum neutralizing value into a network data packet in a manner which minimizes storage requirements and processing time used to process the data packet. In one embodiment, a checksum is calculated as a data packet is being received, up to the checksum field. The calculated checksum is then inserted into the checksum field. Then the remaining fields used to calculate the TCP checksum are summed. The inverse of this sum is then stored in a normally unused portion of the payload portion of the data packet near the end of the packet. When the packet is received and the TCP checksum is calculated, since the inverse of the fields which were not used to calculated the checksum in the TCP header is in the payload portion, their contribution to the checksum is negated so that a comparison of the calculated checksum and the stored TCP checksum will match, assuming the packet was properly received.

12 Claims, 4 Drawing Sheets

| FIELD NO. | BYTES | DATA |
|---|---|---|
| NETWORK PROTOCOL PORTION | | |
| 0.1 | | NETWORK PROTOCOL INFORMATION |
| 0.2 | | TCP CHECKSUM |
| 0.3 | | ADDITIONAL NETWORK PROTOCOL INFORMATION |
| PAYLOAD PORTION | | |
| 1 | 1-N | USER PAYLOAD |
| 2 | 2 | TCP NEUTRALIZER |
| 3 | 2 or 4 | FRAME CHECK SEQUENCE |

Fig. 3

SYSTEM AND METHOD TO INSERT A TCP CHECKSUM IN A PROTOCOL NEUTRAL MANNER

BACKGROUND OF THE INVENTION

The invention has application in the field of network traffic generators and analyzers. More particularly, the invention is directed to a mechanism to insert TCP checksum information in the payload portion, typically, near the end of the a packet, in a protocol neutral way.

Network traffic generators and analyzers are devices used to provide information for use by network administrators to determine the efficiency of the flow of packets over a network and to determine where network bottlenecks exist or may exist. For example, a network, such as a local area network (LAN) or wide area network (WAN) will have connected at several nodes of the network, a network traffic generator which generates packets, which packets are generated using a predetermined software protocol such as IP, IPX, SPX, ICMP, ARP, or RARP, AppleTalk, DECNET or SNA, each of which is defined in an industry standard manner. The software or data communications protocols noted above are independent of the media access control (MAC) utilized such as Ethernet or Token Ring.

It is necessary to have a TCP checksum associated with each data packet so that when the packet is received by a receiving unit, the checksum in the packet can be compared with a checksum calculated when the packet is received to verify that the packet was properly received. With reference to FIG. 1, the TCP checksum is the 16 bit one's complement sum over the TCP header (exclusive of the TCP checksum field itself) and payload portion, i.e., upper layer protocol information., of the packet plus the pseudo header portion.

Each packet is generated by a computer or other device and includes a network protocol portion, i.e., IP header and TCP header and a payload portion, i.e., upper layer protocol information. The TCP checksum is a value calculated based upon information contained in the TCP header and payload portion and part of the IP header portion referred to as the pseudo header. When a packet is received, a receiving unit recalculates the checksum using the data in the pseudo header, TCP header and payload portion of the packet. The calculated checksum is then compared with the checksum in the TCP header. If the two values do not agree, then it is assumed that the packet was transmitted in error and, typically, a request is made to have the packet re-transmitted.

In the prior art, when a frame is received by a network analyzer, in order to calculate the TCP checksum, it is necessary to store the entire frame which may be up to 65535 bytes. That is, since the TCP checksum is located within the TCP header, and since the TCP calculation includes bits which are near the end of the frame, the TCP header with the calculated TCP checksum cannot be transmitted until the entire frame portion needed for the TCP checksum calculation has been received and processed. Since the end of the frame may be many thousand of bytes from its beginning where the TCP checksum is located, the entire frame must be stored while the checksum is being calculated. Then once the TCP checksum has been calculated, the frame must be retrieved from storage and the calculated TCP checksum inserted into the TCP header where indicated at which time the frame can be transmitted. Thus, in addition to the memory required to hold the frame while the checksum is being calculated, additional hardware and processing is needed to perform two data transfer such as DMA (direct memory access) operations, one to store the frame while the checksum is being calculated, and one to retrieve the frame after the calculation has been completed so that the TCP checksum can be inserted into the TCP header and the frame can be transmitted.

SUMMARY OF THE INVENTION

The invention is directed to a method and apparatus for calculating and inserting a TCP checksum neutralizing value into a network data packet in a manner which minimizes storage requirements and processing time used to process the data packet. In one embodiment, a TCP checksum is calculated as a data packet is being received, up to the checksum field. The calculated checksum is then inserted into the checksum field. Then a calculation is performed on the remaining fields used to calculate the TCP checksum. The inverse of this second calculation is then stored in a normally unused portion of the payload portion of the data packet near the end of the packet. In this manner, when the packet is received and the TCP checksum is calculated, since the inverse of the fields which were not used to calculate the checksum in the TCP header is in the payload portion, their contribution to the checksum is negated so that a comparison of the calculated checksum and the stored TCP checksum will match, assuming the packet was properly received.

BRIEF DESCRIPTION OF THE DRAWINGS

FIG. 3 is a representation of the payload portion of a typical data packet.

DETAILED DESCRIPTION OF THE INVENTION

Figure 2:
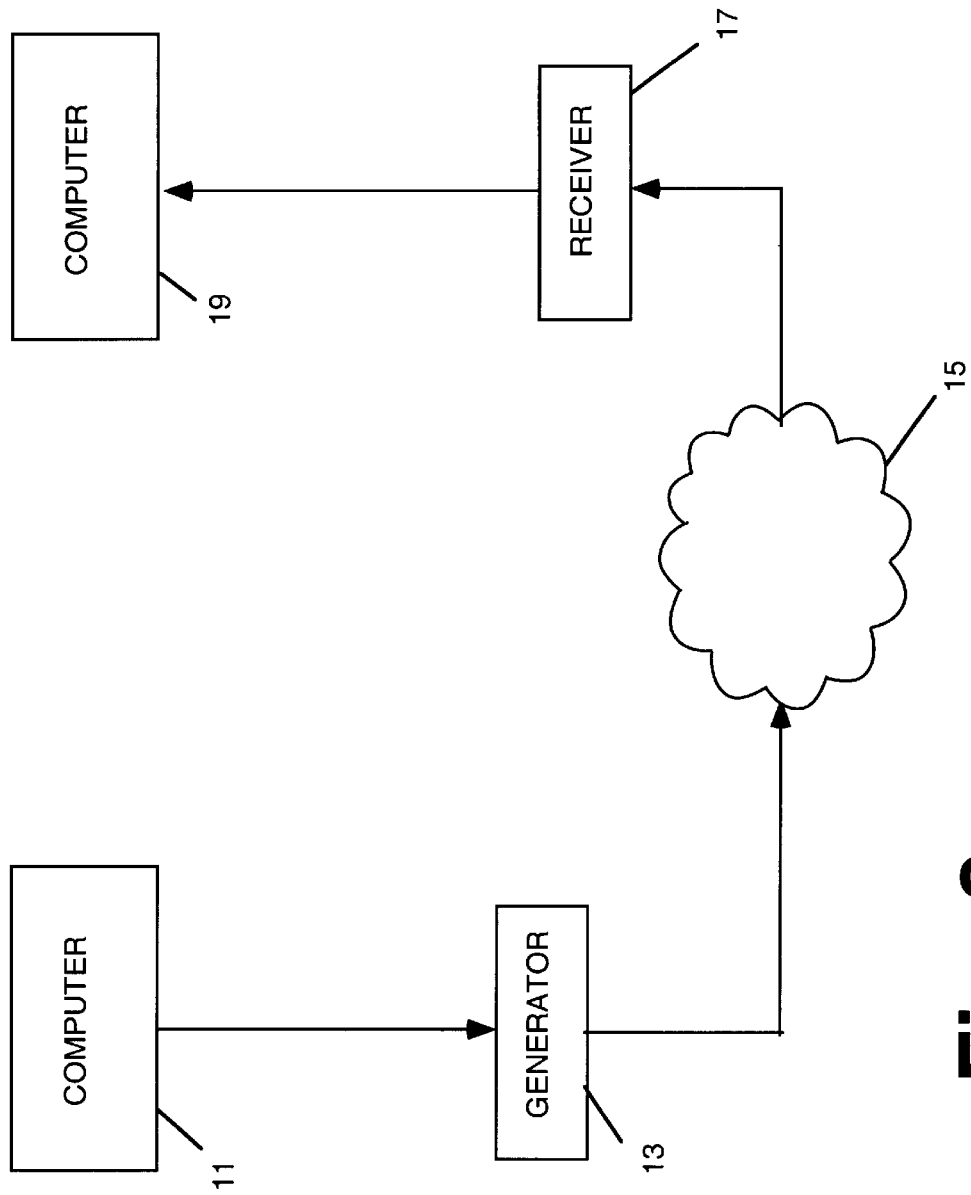
FIG. 2 is a block diagram of a system in connection with which the present invention may be utilized.

Referring to FIG. 2, the present invention is hardware and software elements forming part of generator 13 which cause TCP checksum information to be added to data packets in a manner which does not require storage capacity for the entire packet.

Computer 11 may be any general purpose computer such as a PC running a Windows, Linux or Macintosh operating system or a Unix workstation. Software and hardware in computer 11 generate data packets intended to be sent over network 15 to a desired destination. In a system employing network analyzers, data packets, before being transmitted onto network 15, pass through generator 13 which modifies certain information in the data packets before sending them on to network 15. The data packets are intercepted by receiver 17 which provides additional information such as the time the packet was received, before sending it computer 19. Computer 19 may or may not utilize network 15 or another network, and as shown in FIG. 2, may be connected directly to receiver 17. The packet is received by computer 19 which in the case of a system undergoing an analysis of network traffic typically would be the same, although not necessarily, computer 11.

Figure 1:
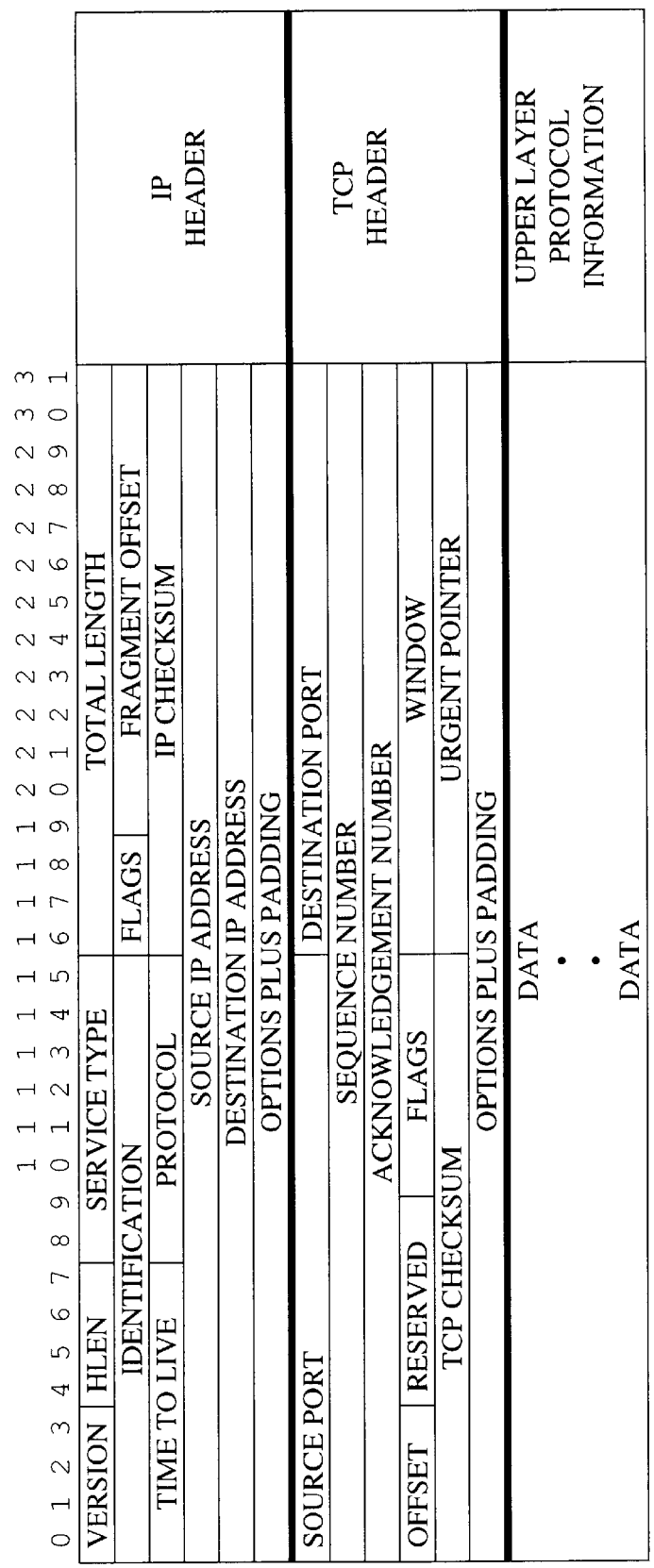
FIG. 1 is a representation of a typical data packet of the type which includes a TCP checksum.

As shown in FIG. 1, a data packet has an IP header portion, a TCP header portion and an upper layer protocol information or payload portion. The IP header and TCP header portions contain network protocol information and a TCP checksum which is calculated as described below.

Referring now to FIG. 3, the payload portion includes an N byte user payload contains information relating to tests to be undertaken by the network analyzer. The content of the user payload, in a packet transmitted for purposes of performing network analysis, except for initial value information in the first packet, is not critical. Included in the user payload may be a 16 bit cyclical redundancy check and an ID number which is formed from an 8 bit port number, a 16 bit stream value, a 4 bit protocol value and 4 bits of user defined data. Data specific to the network analyzer function such as a signature sequence number and a signature timestamp are next. The specifics of content the user payload depends on the network analyzer used and tests being performed, and, in any event, are not important for an understanding of the present invention. The frame check sequence is shown for completeness, but since it is not used to calculate the TCP checksum, it too is not needed for an understanding of the invention except to note its existence and that the neutralizer value determined by the present invention does not take the frame check sequence into account and is inserted into the packer prior to the frame check sequence.

In most cases, all of the data except for the data specific to the network analyzer function are all generated by computer 11. Since the TCP checksum is taken over all of these fields, and since the TCP checksum is physically located near the beginning of a data packet in the network protocol portion, in order to calculate the checksum, it is normally necessary to include sufficient memory to store a complete packet since the beginning of the data packet containing the calculated checksum cannot be sent until the end of the packet, up to the frame check sequence, has been received, and the contribution of all the data in the payload to the checksum calculation included.

Figure 4:
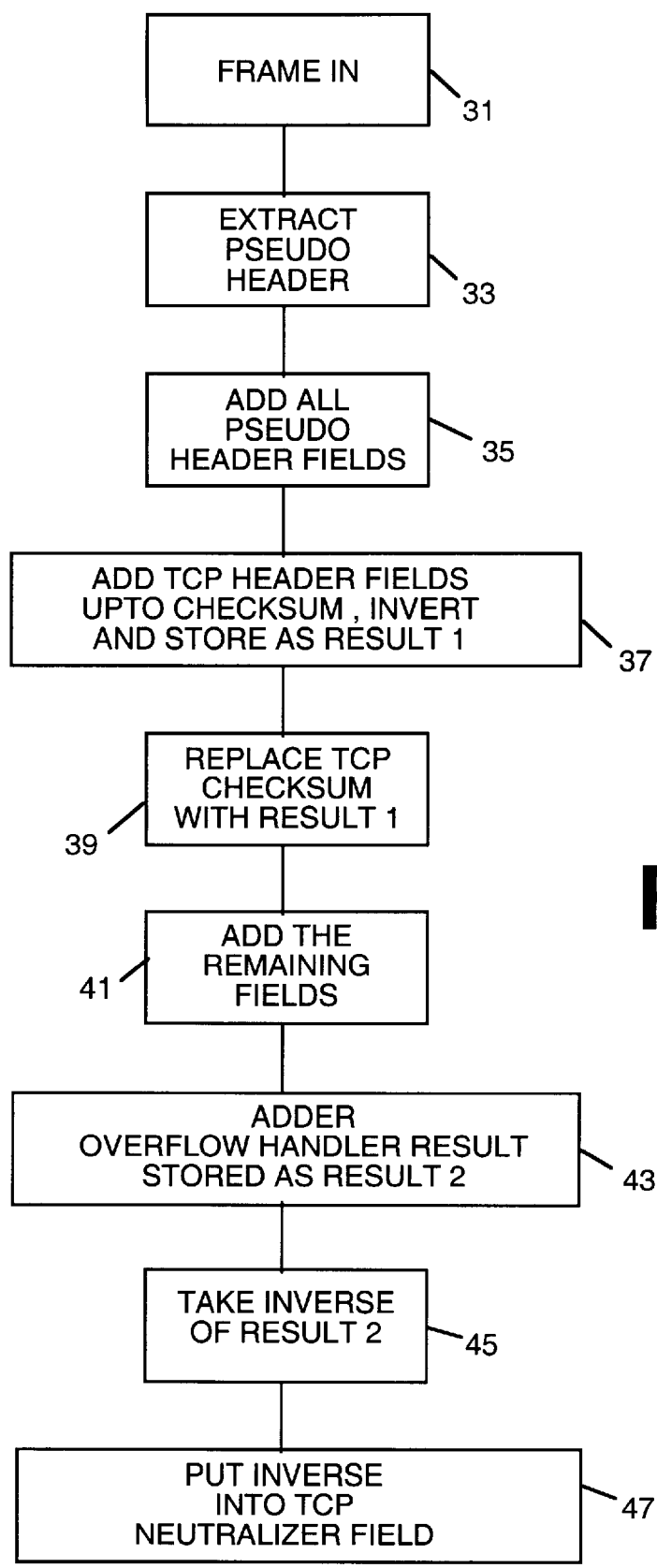
FIG. 4 is a flowchart of the steps used to calculate a TCP checksum neutralizer.

FIG. 4 is a flowchart of processing performed by a packet generator of generator 13 to create a TCP checksum neutralizer in accordance with the invention. A frame is input at step 31 into the packet generator which performs various well known processing steps. One example of a suitable packet generator is sold by Netcom Systems as its model SMB1000 or SMB2000. The present invention improves such prior art packet generator by improving its performance while lowering its cost by changing the manner in which the TCP checksum is calculated. As is well known in the art, the TCP checksum is the 16 bit inverted sum of the pseudo header, the TCP header and upper layer protocol information where, and referring to FIG. 1, the pseudo header is determined using the following portions of the IP header: Total Length-HLEN, Protocol, Source IP Address and Destination IP Address. If a segment contains an odd number of header and text octets forming part of the checksum, the last octet is padded on the right with zeros to form a 16-bit word for checksum purposes. The pad is not transmitted as part of the segment. While computing the checksum, the checksum field itself is replaced with zeros or simply excluded from the computation. After the packet generator has completed updating the packet with information appropriate to the test being performed, the TCP checksum handling according to the present invention is performed.

After the frame has been input, the pseudo header is extracted at step 33. All the pseudo header fields are added at step 35. Then, in the preferred embodiment, the TCP header fields up to the checksum are 16 bit one's complement added at step 37 to form a TCP checksum. In this connection, persons skilled in the art will recognize that any overflow is also added until is no more overflow. One's complement addition is used which results in the inverse of the sum of these fields. Once the aforesaid calculations have been performed, the result is used to replace the TCP checksum at step 39. In this manner, and since a typical network analyzer has a pipeline to hold at least the least five 32 bit words of data, a TCP checksum has been calculated without requiring that any portion of the frame be stored, other than the portion which is contained in the pipeline. At this time, transmission of the packet to its destination may commence even though the rest of the packet has not yet been processed for checksum calculation purposes. Of course, different sized pipelines may also be employed. It should also be noted that the value placed into the TCP checksum field may include portions of the packet past the TCP checksum field itself since the pipeline may be able to store additional portions of the packet, but it typically would not be large enough to store the entire packet.

As the rest of the packet passes through the pipeline, each remaining field is 16 bit one's complement added at step 41. Any adder overflow is also 16 bit one's complement added and the result stored at step 43. Since this one's complement addition is over 16 bits, only 16 bits of additional storage capability is needed. After the entire packet which can affect the TCP checksum calculation has been received, i.e., placed into the pipeline, the inverse of the stored temporary value is taken at step 45 and this value is stored at step 47 near the end of the packet just before the frame check sequence. Of course, if not placed at the end of the packet, then any data after the stored inverse must not change the TCP checksum calculation. Since the calculated value is the inverse of the one's complement of all data after the TCP checksum previously calculated, the calculated value neutralizes the contribution of all data after the TCP checksum previously calculated to the TCP checksum calculation. In this manner, when the packet is received, and the receiver performs its TCP checksum calculation, if the packet was received without any error, the calculated TCP checksum will match the TCP checksum stored in the TCP header. By determining the TCP checksum neutralizer value as the packet is passing through the pipeline, the need to store the packet as the TCP checksum is being calculated is eliminated, thereby eliminating the need for memory sufficient to store an entire packet and the hardware necessary to write the packet to that memory and the hardware necessary to read the packet from that memory.

In this connection, it should be recognized that the only requirement regarding the additional data to add to the payload portion is that such additional data must contain a value which does not cause the payload portion to have a different checksum calculated after the data has been added.

Typically, a network analyzer includes both a transmit generator and a receive analyzer with one or the other being utilized at any one time. The transmit generator is the element which is modified to implement the present invention, with the receive analyzer remaining as in the prior art. The various processing steps performed by the transmit generator as described above with reference to FIG. 4 may be implemented using latches, one's complement adder with overflow handling and logic circuitry according to well known techniques. Alternatively, one or more of the processing steps may be performed using software or firmware.

I claim:

1. A method for calculating a transmission control protocol (TCP) checksum for a data packet having a TCP checksum field to be transmitted over a network, said method comprising the steps of:

a) extracting a predetermined portion of the packet, wherein said predetermined portion is less than the portion needed to calculate a TCP checksum for the packet;

b) adding the extracted portions and any overflow 16 bits at a time to form a first result;

c) inverting the first result to form the TCP checksum;

d) inserting the TCP checksum into the TCP checksum field;

e) adding the remaining portions of the packet and any overflow 16 bits at a time to form a second result;

f) inverting the second result to form a TCP checksum neutralizer;

g) inserting said TCP neutralizer into said packet at a predetermined position.

2. The method defined by claim 1 wherein said packet includes a network protocol portion and a payload portion, and the neutralizer field is inserted within said payload portion at said predetermined position.

3. The method defined by claim 1 wherein the inverting steps utilize a bit by bit inverse.

4. The method defined by claim 1 wherein the adding and inverting steps utilize a one's complement addition.

5. An apparatus for calculating a transmisson control protocol (TCP) checksum of a packet to be transmitted over a network comprising:

a network traffic generator including a) means for extracting a predetermined portion of the packet, wherein said predetermined portion is less than the portion needed to calculate a TCP checksum for the packet;

b) means for adding the extracted portions and any overflow 16 bits at a time to form a first result;

c) means for inverting the first result to form the TCP checksum;

d) means for inserting the TCP checksum into the TCP checksum field;

e) means for adding the remaining portions of the packet and any overflow 16 bits at a time to form a second result;

f) means for inverting the second result to form a TCP checksum neutralizer;

g) means for inserting said TCP neutralizer into said packet at a predetermined position.

6. The system defined by claim 5 wherein the means for extracting comprises a pipeline adapted to store at least five 32 bit words.

7. The system defined by claim 5 wherein the means for adding the extracted portions and any overflow comprises a one's complement adder.

8. The system defined by claim 5 wherein the means for inverting the first result comprises a one's complement adder.

9. The system defined by claim 5 wherein the means for inserting the TCP checksum into the TCP checksum field comprises a set of latches.

10. The system defined by claim 5 wherein the means for adding the remaining portions of the packet and any overflow comprises a one's complement adder.

11. The system defined by claim 5 wherein the means for inverting the second result comprises a one's complement adder.

12. The system defined by claim 5 wherein the means for inserting said TCP neutralizer into said packet at a predetermined position comprises a set of latches.

\* \* \* \* \*